United States Patent
Guo et al.

(10) Patent No.: US 9,681,560 B2
(45) Date of Patent: Jun. 13, 2017

(54) CABINET AND CABINET GROUP INCLUDING THE SAME

(71) Applicant: Huawei Technologies Co., Ltd., Shenzhen (CN)

(72) Inventors: Haihui Guo, Shenzhen (CN); Junpeng Huang, Shenzhen (CN); Lixin Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/876,251

(22) Filed: Oct. 6, 2015

(65) Prior Publication Data

US 2016/0029497 A1  Jan. 28, 2016

Related U.S. Application Data

(63) Continuation of application No. PCT/CN2013/086205, filed on Oct. 30, 2013.

(30) Foreign Application Priority Data

Apr. 7, 2013  (CN) .......................... 2013 1 0117633

(51) Int. Cl.
*H05K 5/00* (2006.01)
*H05K 7/18* (2006.01)
(Continued)

(52) U.S. Cl.
CPC ......... *H05K 5/0021* (2013.01); *A47B 47/005* (2013.01); *A47B 47/0008* (2013.01);
(Continued)

(58) Field of Classification Search
CPC .......... H02B 1/014; H02B 1/013; H02B 1/28; H02B 1/301; H05K 9/0015;
(Continued)

(56) References Cited

U.S. PATENT DOCUMENTS 3,485,405 A * 12/1969 Dement ................... B65D 9/32
217/65
4,123,129 A  10/1978 Butler
(Continued)

FOREIGN PATENT DOCUMENTS

CN  201011749 Y  1/2008
CN  201262315 Y  6/2009
(Continued)

OTHER PUBLICATIONS

Foreign Communication From a Counterpart Application, European Application No. 13881470.2, Extended European Search Report dated Mar. 16, 2016, 8 pages.
(Continued)

*Primary Examiner* — Janet M Wilkens
(74) *Attorney, Agent, or Firm* — Conley Rose, P.C.

(57) ABSTRACT

A cabinet includes a base, a top frame, at least three vertical pillar assemblies which are disposed between the base and the top frame, a cover, and at least three side plates. The cover is disposed at a side of the top frame, that is opposite to the side facing the base. A vertical pillar assembly includes a pillar, an inner clamp, and an outer clamp, wherein the inner clamp includes a first and a second side edge, and the outer clamp includes a third and a fourth side edge. The pillar is clamped between the inner clamp and the outer clamp. Space between the first side edge and the third side edge of the outer clamp is used for clamping a side plate, and space between the second side edge and the fourth side edge of the outer clamp is used for clamping a side plate.

17 Claims, 24 Drawing Sheets

(51) Int. Cl.
*A47B 47/00* (2006.01)
*A47B 55/00* (2006.01)
*H05K 5/02* (2006.01)

(52) U.S. Cl.
CPC .......... *A47B 47/0091* (2013.01); *A47B 55/00* (2013.01); *H05K 7/186* (2013.01); *H05K 5/0217* (2013.01); *H05K 5/0234* (2013.01)

(58) Field of Classification Search
CPC ............ A47B 2230/01; A47B 47/0008; A47B 47/045; A47B 47/03
USPC ........ 403/169–178, 248–250, 231, 217, 403; 52/655.1; 312/265.1–265.4, 223.1, 140, 312/296; 211/26, 189, 182, 175, 191, 211/192
See application file for complete search history.

(56) References Cited

U.S. PATENT DOCUMENTS

| | | | | |
|---|---|---|---|---|
| 4,689,930 | A * | 9/1987 | Menchetti | E04B 2/7409 52/275 |
| 6,682,256 | B1 * | 1/2004 | Hor | A47B 47/00 403/331 |
| 6,945,616 | B2 * | 9/2005 | Webster | H02B 1/50 312/223.1 |
| 7,802,408 | B2 * | 9/2010 | Asbury | F16B 5/02 403/21 |
| 2004/0074204 | A1 * | 4/2004 | McKinnon | A47B 47/03 52/781 |
| 2006/0261015 | A1 | 11/2006 | Blackwell | |
| 2007/0163979 | A1 * | 7/2007 | Carruthers | A47B 47/03 211/189 |
| 2009/0273892 | A1 | 11/2009 | Cheng | |
| 2012/0019118 | A1 | 1/2012 | Fan | |
| 2012/0206876 | A1 | 8/2012 | Chen | |
| 2013/0034383 | A1 * | 2/2013 | Chong | E04B 1/24 403/231 |
| 2016/0095430 | A1 * | 4/2016 | Moyer | A47B 47/0091 312/265.4 |

FOREIGN PATENT DOCUMENTS

| | | | |
|---|---|---|---|
| CN | 101494965 | A | 7/2009 |
| CN | 101808480 | A | 8/2010 |
| CN | 201601919 | A | 10/2010 |
| CN | 101902891 | A | 12/2010 |
| CN | 102340967 | A | 2/2012 |
| CN | 202799446 | U | 3/2013 |
| DE | 2132153 | * | 1/1972 |
| EP | 0448545 | A1 | 3/1991 |
| EP | 1235321 | * | 8/2002 |
| WO | 0191529 | * | 11/2001 |

OTHER PUBLICATIONS

Partial English Translation and Abstract of Chinese Patent Application No. CN101808480, Jan. 15, 2016, 4 pages.
Partial English Translation and Abstract of Chinese Patent Application No. CN201262315, Jan. 15, 2016, 3 pages.
Partial English Translation and Abstract of Chinese Patent Application No. CN201601919, Jan. 15, 2016, 4 pages.
Partial English Translation and Abstract of Chinese Patent Application No. CN101902891, Oct. 12, 2016, 5 pages.
Partial English Translation and Abstract of Chinese Patent Application No. CN201011749, Jan. 15, 2016, 3 pages.
Foreign Communication From a Counterpart Application, PCT Application No. PCT/CN2013/086205, English Translation of International Search Report dated Feb. 20, 2014, 2 pages.
Foreign Communication From a Counterpart Application, PCT Application No. PCT/CN2013/086205, English Translation of Written Opinion dated Feb. 20, 2014, 8 pages.

\* cited by examiner

CABINET AND CABINET GROUP INCLUDING THE SAME

CROSS-REFERENCE TO RELATED APPLICATIONS

This application is a continuation of International Application No. PCT/CN2013/086205, filed on Oct. 30, 2013, which claims priority to Chinese Patent Application No. 201310117633.6, filed on Apr. 7, 2013, both of which are hereby incorporated by reference in their entireties.

TECHNICAL FIELD

The present disclosure relates to the communications field, and in particular, to a cabinet and a cabinet group including the same.

BACKGROUND

An existing single-cabin cabinet mainly uses a bottom plate, a top plate, and left and right side plates (or a frame) to form a skeleton by means of welding, and reinforcing ribs are welded in different positions inside the cabinet as required. Because a single-cabin cabinet is formed by welding plates, left and right side plates, a bottom plate, and a cover of the cabinet cannot be freely changed, so that such a cabinet has a low modularization degree and poor flexibility. Moreover, total welding processing of the cabinet leads to time-consuming assembly and difficult moving.

SUMMARY

Embodiments of the present disclosure aim to resolve problems of low modularization and difficult assembly of a cabinet in the prior art.

To achieve the foregoing objective, the embodiments of the present disclosure provide the following technical solutions.

According to a first aspect, a cabinet is provided, where the cabinet includes a base, at least three vertical pillar assemblies, a top frame, a cover, and at least three side plates, where the base and the top frame are disposed opposite to each other; the cover is disposed at a side, of the top frame, that is far away from the base; the at least three vertical pillar assemblies are disposed between the base and the top frame; two opposite side edges of each of the at least three side plate are respectively clamped to two adjacent vertical pillar assemblies among the at least three vertical pillar assemblies; at least one of the at least three vertical pillar assemblies includes a pillar, an inner clamp, and an outer clamp, where the inner clamp includes a first side edge and a second side edge, where end faces of the first side edge and the second side edge form an "L" shape, the outer clamp includes a third side edge and a fourth side edge, where end faces of the third side edge and the fourth side edge form an "L" shape, the pillar is clamped between the inner clamp and the outer clamp, space between the first side edge of the inner clamp and the third side edge of the outer clamp is used for clamping the side plate, and space between the second side edge of the inner clamp and the fourth side edge of the outer clamp is used for clamping the side plate; and the at least three side plates, the base, the top frame, and the cover enclose a housing cavity.

In a first possible implementation manner, the inner clamp and the pillar are integrated as one.

In a second possible implementation manner, the outer clamp is detachably fastened to the pillar.

In a third possible implementation manner, the outer clamp is fixedly connected to the pillar using a guide rail and a chute.

With reference to the third possible implementation manner, in a fourth possible implementation manner, the outer clamp is provided with the guide rail, and the pillar is provided with the chute that cooperates with the guide rail.

With reference to the third possible implementation manner, in a fifth possible implementation manner, the outer clamp is provided with the chute, and the pillar is provided with the guide rail that cooperates with the chute.

In a sixth possible implementation manner, the outer clamp is connected to the pillar using bolts.

In a seventh possible implementation manner, the outer clamp is connected to the pillar using pins.

In an eighth possible implementation manner, the pillar is a straight quadrangular prism, and the inner clamp is located at a side edge in a vertex angle position inside the pillar.

With reference to the eighth possible implementation manner, in a ninth possible implementation manner, the third side edge and the fourth side edge of the outer clamp are detachably fastened to two side faces outside the pillar.

In a tenth possible implementation manner, a nut strip is fastened to at least one of the first side edge and the second side edge, and the cabinet includes a bearing face and a holder, where the holder is fastened vertical to the base, and the nut strip is fixedly connected to the holder.

With reference to the tenth possible implementation manner, in an eleventh possible implementation manner, the cabinet includes four holders, where the four holders are respectively fastened at four corners of the base.

With reference to the tenth possible implementation manner, in a twelfth possible implementation manner, the cabinet includes the nut strip, at least one of the first side edge and the second side edge of the inner clamp is provided with a chute, and two sides of the nut strip slide cooperatively in the chute.

With reference to the tenth possible implementation manner, in a thirteenth possible implementation manner, the cabinet includes the nut strip, where the nut strip is fastened to at least one of the first side edge and the second side edge using bolts.

With reference to the tenth possible implementation manner, in a fourteenth possible implementation manner, the cabinet includes the nut strip, where the nut strip is fastened to at least one of the first side edge and the second side edge using pins.

According to another aspect, a cabinet group is provided, where the cabinet group includes a first cabinet, a second cabinet, and a combining bar, where the first cabinet and the second cabinet are disposed side by side, and the first cabinet and the second cabinet each include a base, at least three vertical pillar assemblies, a top frame, a cover, and at least three side plates, where the base and the top frame are disposed opposite to each other; the cover is disposed at a side, of the top frame, that is far away from the base; the at least three vertical pillar assemblies are disposed between the base and the top frame; two opposite side edges of each side plate are respectively clamped to two adjacent vertical pillar assemblies; at least one of the vertical pillar assemblies includes a pillar, an inner clamp, and an outer clamp, where the inner clamp includes a first side edge and a second side edge, where end faces of the first side edge and the second side edge form an "L" shape, the outer clamp includes a third side edge and a fourth side edge, where end faces of the third side edge and the fourth side edge form an "L" shape, the pillar is clamped between the inner clamp and the outer clamp, space between the first side edge of the inner clamp and the third side edge of the outer clamp is used for clamping the side plate, and space between the second side edge of the inner clamp and the fourth side edge of the outer clamp is used for clamping the side plate; two adjacent pillars of the first cabinet and the second cabinet are each provided with the inner clamp and the third side edge of the outer clamp; a side plate is clamped between second side edges of the two inner clamps of the two adjacent pillars; and the two adjacent pillars of the first cabinet and the second cabinet are assembled using the combining bar.

In a first possible implementation manner, the combining bar is fixedly connected to the pillars using chutes and guide rails.

In a second possible implementation manner, the combining bar is fixedly connected to the pillars using bolts.

In a third possible implementation manner, the combining bar is fixedly connected to the pillars using pins.

In a fourth possible implementation manner, the cabinet group further includes a third cabinet, where the third cabinet includes a base, at least three vertical pillar assemblies, a top frame, a cover, and at least three side plates, where the base and the top frame are disposed opposite to each other; the cover is disposed at a side, of the top frame, that is far away from the base; the at least three vertical pillar assemblies are disposed between the base and the top frame; two opposite side edges of each side plate are respectively clamped to two adjacent vertical pillar assemblies; at least one of the vertical pillar assemblies includes a pillar, an inner clamp, and an outer clamp, where the inner clamp includes a first side edge and a second side edge, where end faces of the first side edge and the second side edge form an "L" shape, the outer clamp includes a third side edge and a fourth side edge, where end faces of the third side edge and the fourth side edge form an "L" shape, the pillar is clamped between the inner clamp and the outer clamp, space between the first side edge of the inner clamp and the third side edge of the outer clamp is used for clamping the side plate, and space between the second side edge of the inner clamp and the fourth side edge of the outer clamp is used for clamping the side plate; two adjacent pillars of the second cabinet and the third cabinet are provided with the inner clamp and the third side edge of the outer clamp; a side plate is clamped between second side edges of the two inner clamps of the two adjacent pillars; and the adjacent pillars of the second cabinet and the third cabinet are assembled using a combining bar.

In a fifth possible implementation manner, the cabinet group includes a connection pipe, where the connection pipe is connected between the bases of the first cabinet and the second cabinet that are adjacent using bolts.

In a sixth possible implementation manner, the combining bar further includes two flanges, where the two flanges are respectively sealed on two side walls of chutes of the first cabinet and the second cabinet that are adjacent.

According to the cabinet provided by the present disclosure, a forming process of a vertical pillar assembly can be simplified by assembly of a detachable outer clamp.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

In the embodiments of the present disclosure, a forming process of a vertical pillar assembly can be simplified by assembly of a detachable outer clamp.

Figure 1:
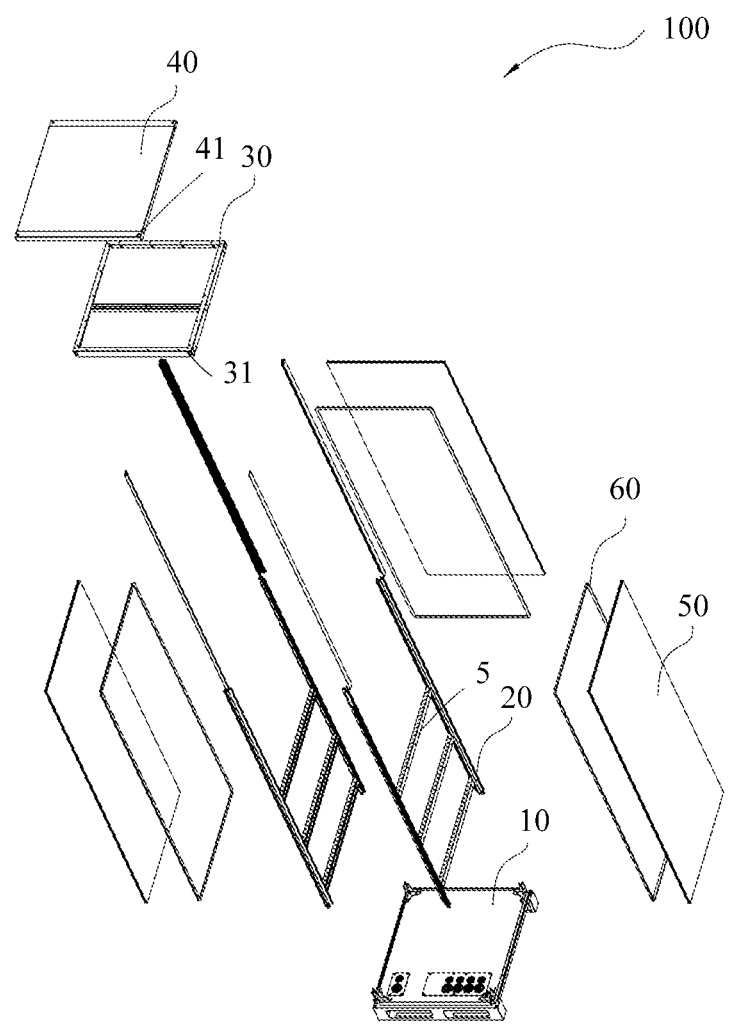
FIG. 1 is a schematic exploded view of a cabinet according to a first embodiment of the present disclosure.
Figure 2:
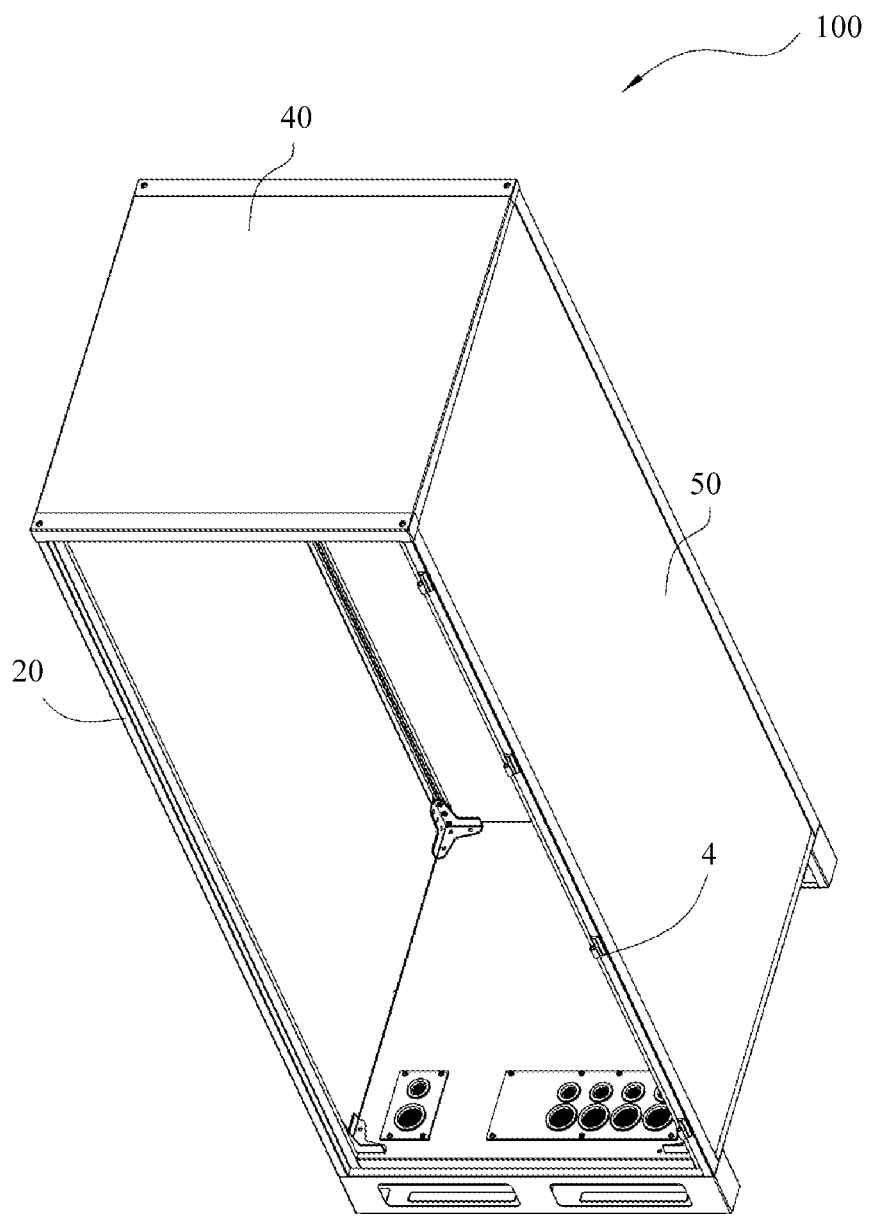
FIG. 2 is a schematic diagram of assembly of the cabinet in FIG. 1.
Figure 3:
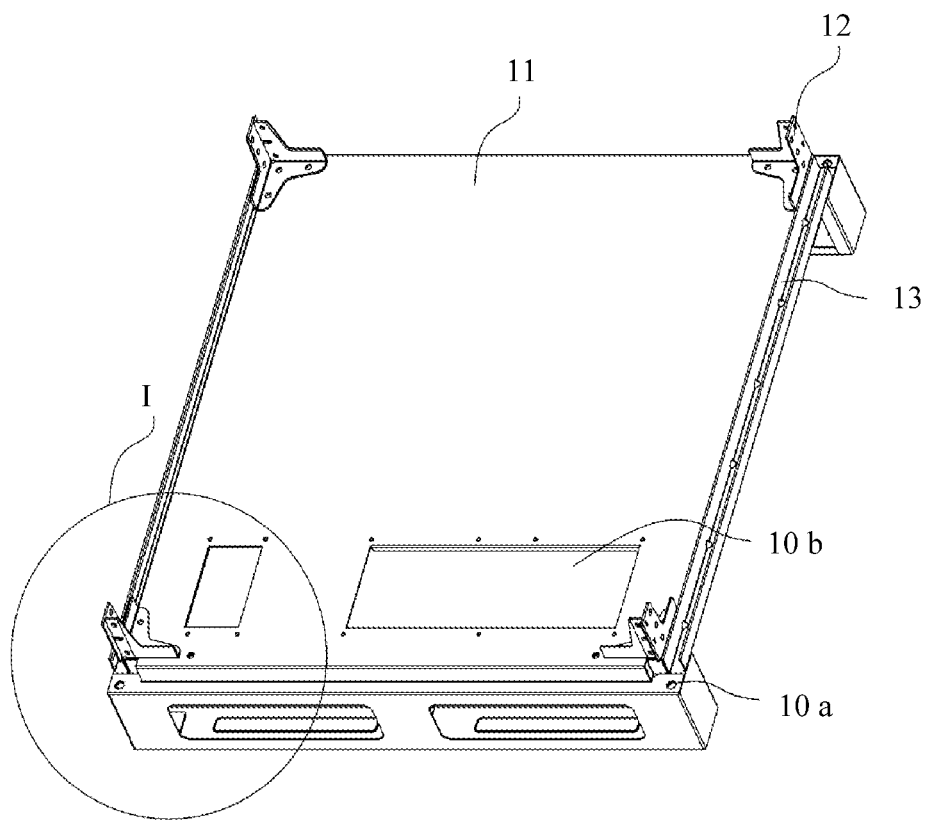
FIG. 3 is a schematic diagram of a base of the cabinet in FIG. 1.

Referring to FIG. 1 to FIG. 3, a first embodiment of the present disclosure provides a cabinet 100, where the cabinet 100 includes a base 10, four vertical pillar assemblies 20, a top frame 30, a cover 40, and four side plates 50. In other implementation manners, according to a shape of the cabinet 100, the cabinet 100 may also include three or more vertical pillar assemblies 20 and three side plates 50, to adapt to cabinets with other shapes, such as a triangular prism shape and pentagonal prism shape. The base 10 and the top frame 30 are disposed opposite to each other. In this implementation manner, the base 10 is a rectangular platy structure. The base 10 may be a battery compartment base or another type of base. The base 10 includes a bearing face 11 and holders 12. Four enclosure bulkheads 13 are processed around the bearing face 11 for pasting of a waterproof rubber strip 60, to achieve waterproofing between the enclosure bulkheads 13 and a door plate or a wall plate. If the cabinet 100 is used indoors, the waterproof rubber strip 60 may be also omitted. Four corners of the bearing face 11 are designed with four via holes 10a, where the via holes 10a are used for fastening the vertical pillar assemblies 20. The bearing face 11 is further provided with a cable-through hole 10b for installation of a cable outlet module of the cabinet 100.

Figure 4:
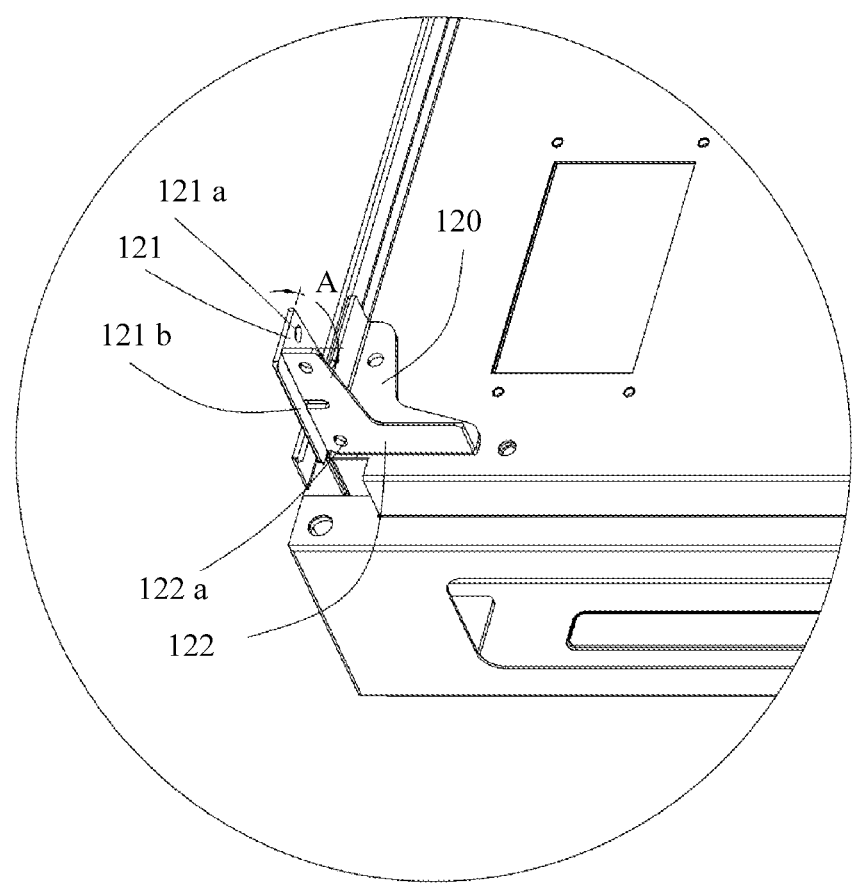
FIG. 4 is a partial enlarged diagram of part I in FIG. 3.
Figure 5:
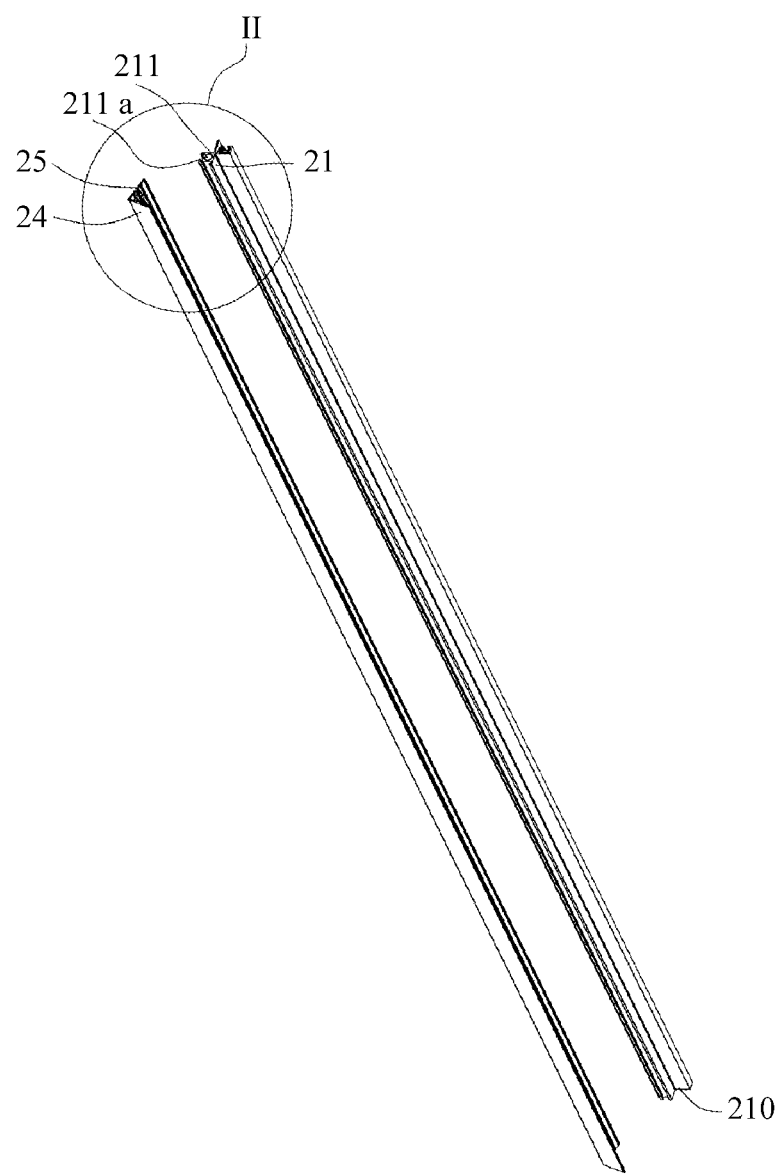
FIG. 5 is a schematic diagram of a vertical pillar assembly of a cabinet according to the present disclosure.
Figure 6:
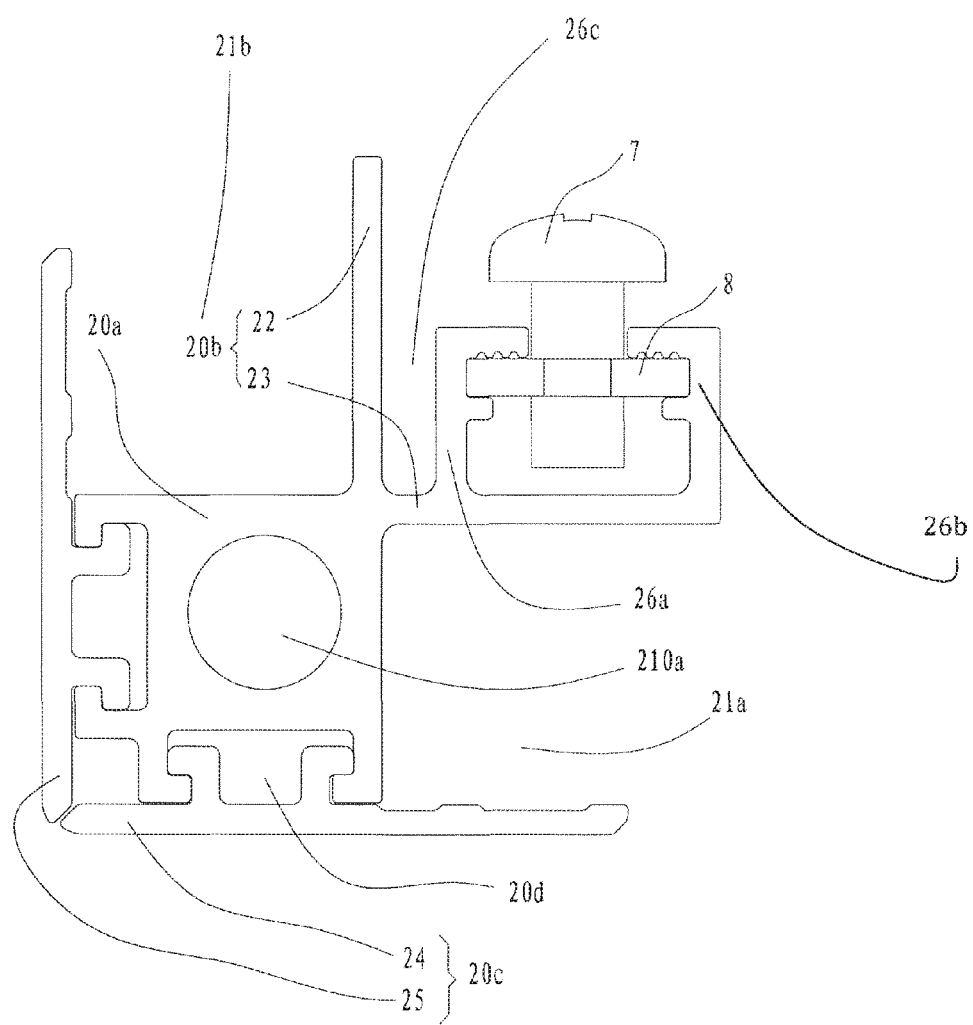
FIG. 6 is a schematic diagram of another angle of view of the vertical pillar assembly in FIG. 5.
Figure 7:
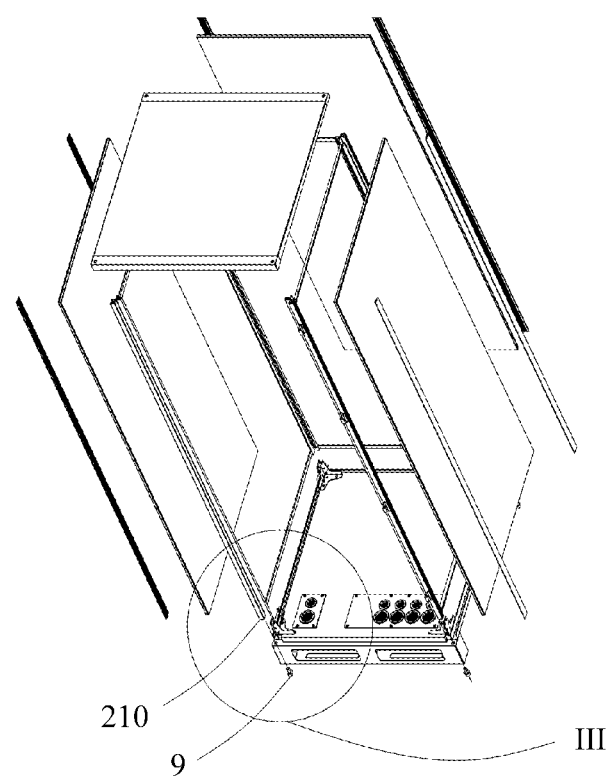
FIG. 7 is an exploded diagram of a part of the cabinet according to the first embodiment of the present disclosure.
Figure 8:
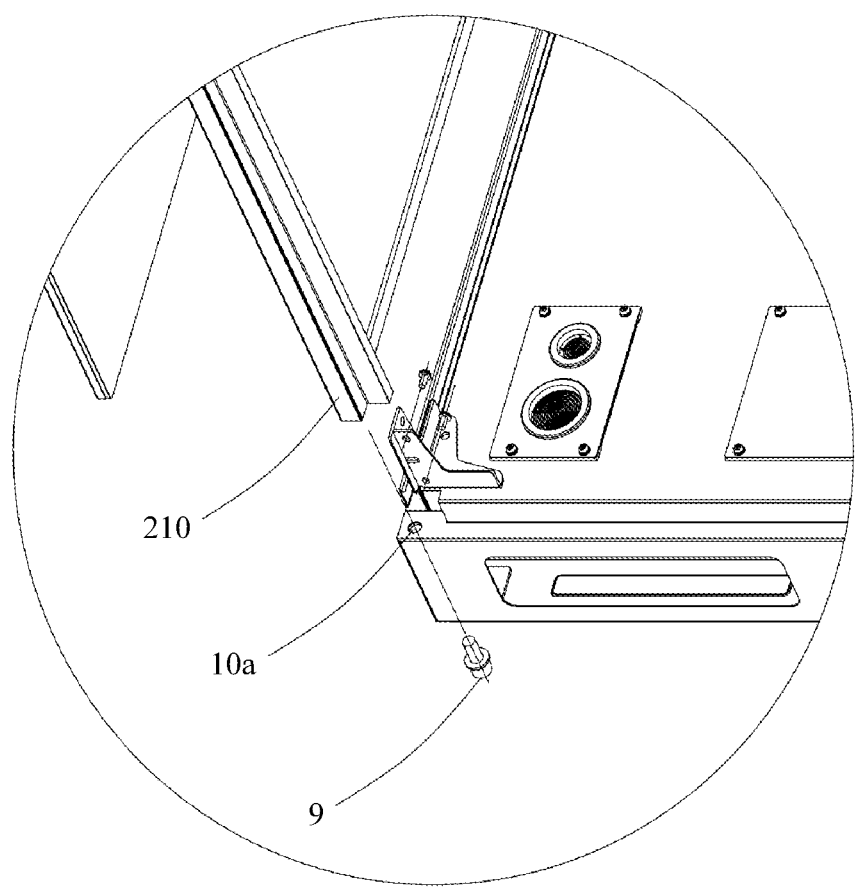
FIG. 8 is a partial enlarged diagram of part III in FIG. 7.

The holders 12 are fastened vertically on the bearing face 11. In this implementation manner, the base 10 includes four holders 12, where the four holders 12 are respectively located at four corners of the base 10. The holders 12 are fastened vertically at the four corners of the bearing face 11, and are used to enhance connection between the vertical pillar assemblies 20 and the base 10. Referring to FIG. 4, a holder 12 includes a bottom connecting piece 120, a first side connecting piece 121, and a second side connecting piece 122. The bottom connecting piece 120 is fastened to the bearing face 11, and the bottom connecting piece 120 is fastened to the bearing face 11 using bolts. The first side connecting piece 121 and the second side connecting piece 122 are fastened to the bottom connecting piece 120, and a preset included angle A is presented between the first side connecting piece 121 and the second side connecting piece 122, where the preset included angle A is greater than 0 degrees and less than 180 degrees. In this implementation manner, the preset included angle A is a right angle. Both the first side connecting piece 121 and the second side connecting piece 122 are vertical to the bottom connecting piece 120. The first side connecting piece 121 is provided with through holes 121a, which are used to implement combining of two cabinets 100, and an edge 121b of the first side connecting piece 121 is protruding relative to the second side connecting piece 122, and is used to enhance fastening of a vertical pillar assembly 20. The second side connecting piece 122 is provided with through holes 122a, which are used to connect the vertical pillar assembly 20. In other implementation manners, the preset included angle A may also be an acute angle or an obtuse angle, to adapt to cabinets in different shapes. The edge 121b of the first side connecting piece 121 may be also aligned with an edge of the second side connecting piece 122.

Referring to FIG. 5 to FIG. 8, each of the vertical pillar assemblies 20 includes a pillar 20a, an inner clamp 20b, and an outer clamp 20c. In other implementation manners, there may be only one vertical pillar assembly 20 that includes a pillar 20a, an inner clamp 20b, and an outer clamp 20c. The inner clamp 20b includes a first side edge 23 and a second side edge 24, where end faces of the first side edge 23 and the second side edge 24 form an "L" shape. The outer clamp 20c includes a third side edge 25 and a fourth side edge 24, where end faces of the third side edge 215 and the fourth side edge 214 form an "L" shape, and the pillar 20a is clamped between the inner clamp 20b and the outer clamp 20c. Space 21b between the first side edge 23 of the inner clamp 20b and the third side edge 25 of the outer clamp 20c is used for clamping a side plate 50, and space 21a between the second side edge 24 of the inner clamp 20b and the fourth side edge 24 of the outer clamp 20c is used for clamping the side plate 50. In this implementation manner, the pillar 21 is a straight quadrangular prism, one end 210 of the pillar 21 is bolted to the base 10, and the other end 211 of the pillar 21 is bolted to the top frame 30. The one end 210 of the pillar 21 is provided with a bolt hole 210a, where the bolt hole 210a and a via hole 10a of the bearing face 11 are coaxial, to lock tightly using a bolt 9. The other end 211 of the pillar 21 is bolted to the top frame 30 using a nut strip 8 and a bolt 7. The other end 211 of the pillar 21 is provided with a bolt hole 211a to connect the cover 40.

The inner clamp 20b is located at a side edge in a vertex angle position inside the pillar 20a. The inner clamp 20b and the pillar 20a are integrated as one. The first side edge 23 and the second side edge 24 are vertical to each other. The first side edge 22 and the second side edge 23 are integrated as one together with the pillar 21. The first side edge 22 and the second side edge 23 are extended by a chamfered edge 216 that is connected to a first side wall 212 and a second side wall 213, where the first side edge 22 is parallel to the first side wall 212, and the second side edge 23 is parallel to the second side wall 213. The first side edge 22 and the second side edge 23 are connected in a right angle, and the first side edge 22 and the second side edge 23 extend along an axial direction of the pillar 21. A connected part of the first side edge 22 and the second side edge 23 is connected to a side edge in a vertex angle position inside the pillar 20a.

Figure 9:
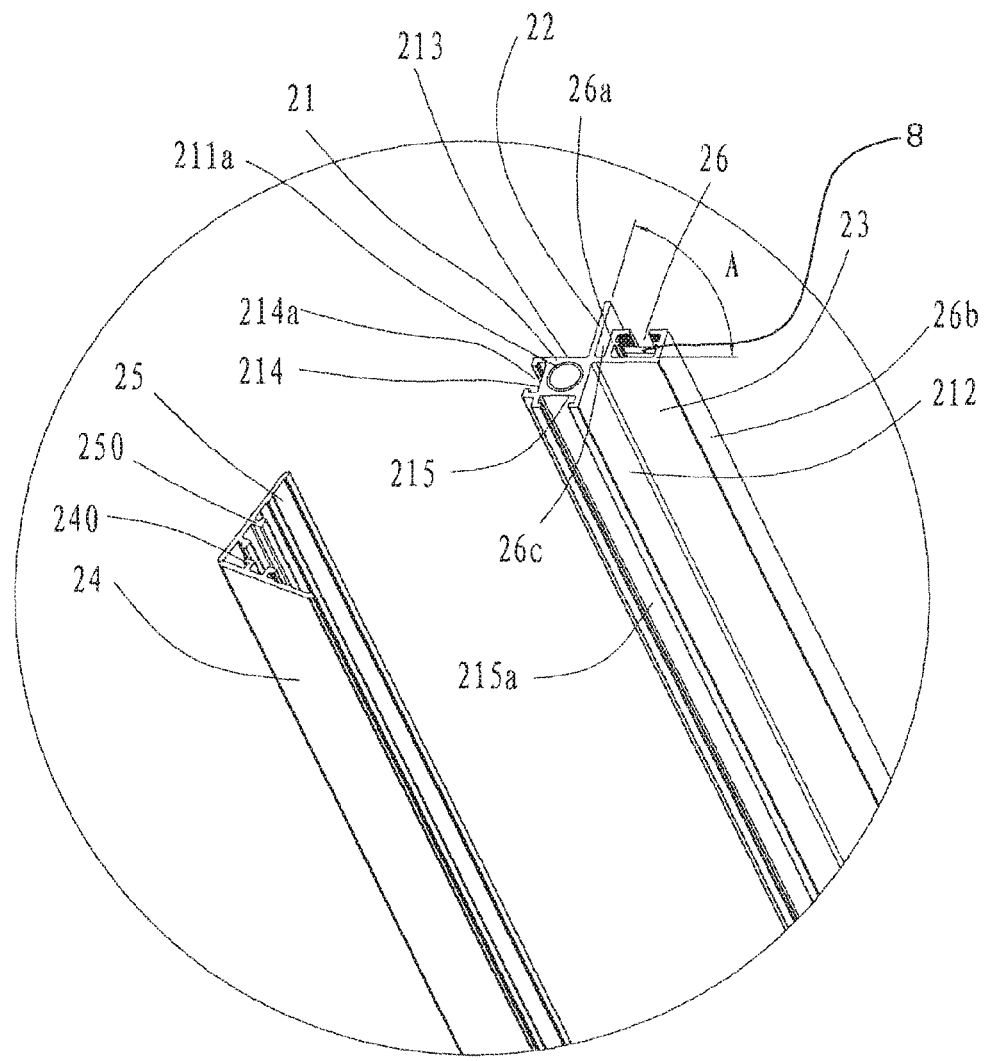
FIG. 9 is a partial enlarged diagram of part II in FIG. 5.
Figure 10:
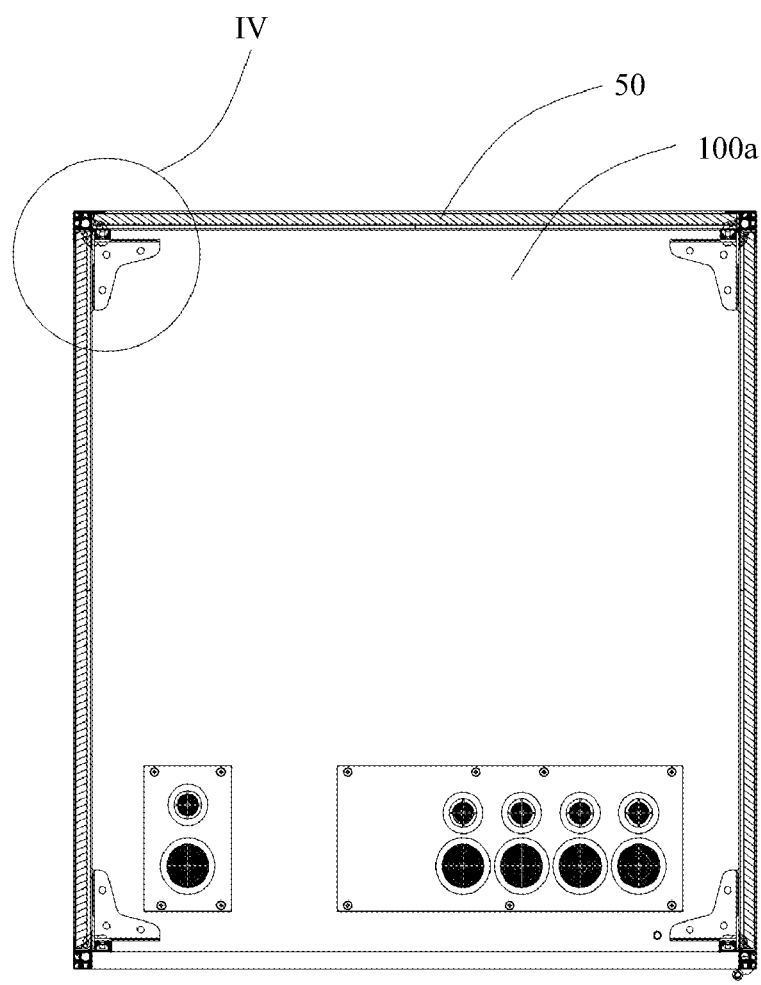
FIG. 10 is a cutaway view after assembly of the cabinet in FIG. 1.
Figure 11:
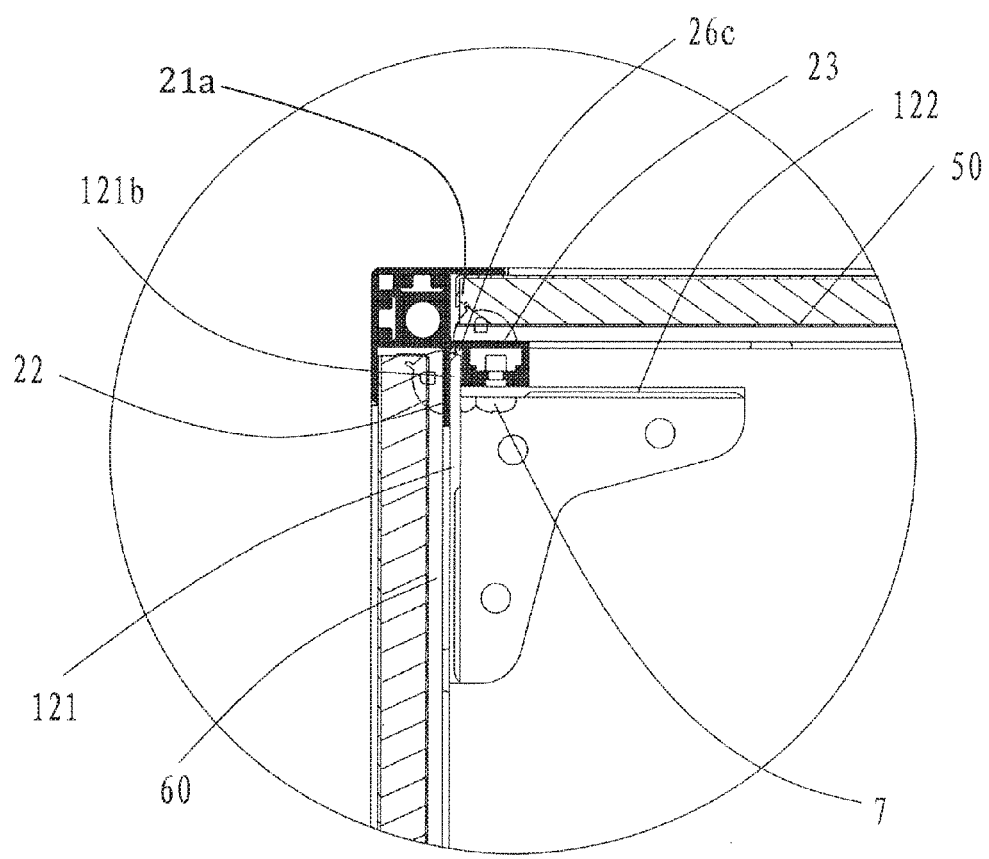
FIG. 11 is a partial enlarged diagram of part IV in FIG. 10.
Figure 12:
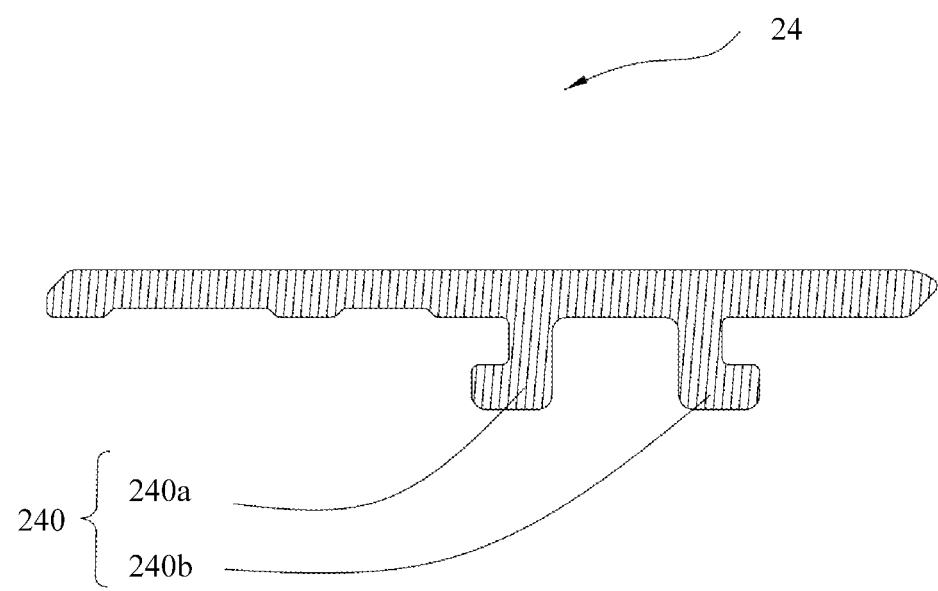
FIG. 12 is a schematic diagram of a third side edge of a cabinet according to the present disclosure.
Figure 13:
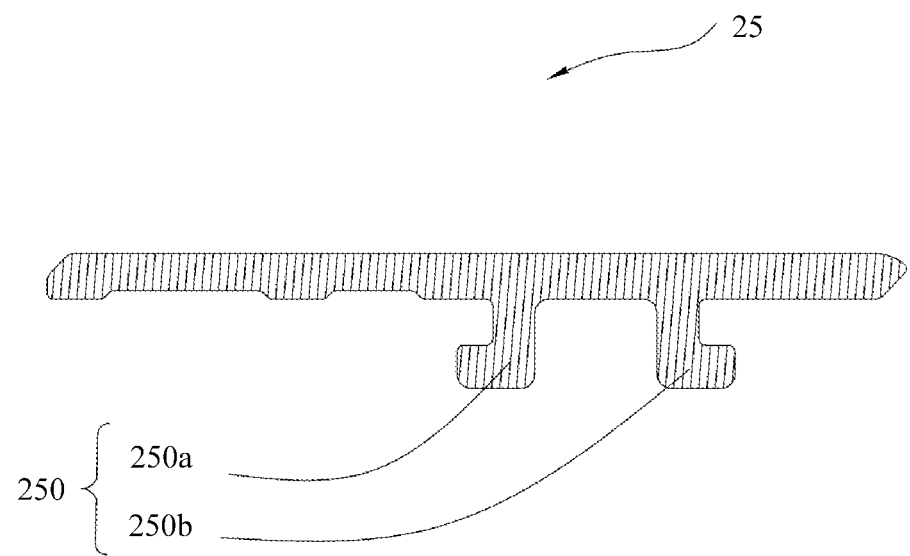
FIG. 13 is a schematic diagram of a fourth side edge of a cabinet according to the present disclosure.

The nut strip 8 is fastened to at least one of the first side edge 22 and the second side edge 23, where the nut strip 8 is fixedly connected to a holder 12. The nut strip 8 may be fastened to the first side edge 22 or the second side edge 23 in multiple manners. It may be that at least one of the first side edge 22 and the second side edge 23 of the inner clamp 20b is provided with a chute, and two sides of the nut strip 8 slide cooperatively in the chute; or the nut strip 8 is fastened to at least one of the first side edge 22 and the second side edge 23 using bolts; or the nut strip 8 is fastened to at least one of the first side edge 22 and the second side edge 23 using pins. In this implementation manner, the second side edge 23 is provided with a chute 26, where the chute 26 extends along an axial direction of the pillar 21, the chute 26 is a T-shaped groove, and the chute 26 includes two side walls 26a and 26b that are disposed opposite to each other, and the side wall 26b that is farther away from the first side edge 22 and the second side edge 23 are integrated as one. A slot 26c (referring to FIG. 6) is formed on an outer surface of the pillar 21, and the slot 26c is located between a side wall of the pillar 21 adjacent to the chute 26 and the first side edge 23. The first side connecting piece 121 is inserted in the slot 26c, and the slot 26c is used to clamp an edge 121b (referring to FIG. 9 and FIG. 10) of the first side connecting piece 121, that is, the first side connecting piece 121 is inserted in the slot 26cConnecting strength between the base 10 and the vertical pillar assembly is increased. A bolt hole of the nut strip 8 is faced with an opening of the chute 26. The nut strip 8 may be further used for installing a beam 5 (referring to FIG. 1), such that other components can be installed in the cabinet 100.

The outer clamp 20c is detachably fastened to the pillar 21. The outer clamp 20c may be fastened to the pillar 21 in multiple manners. For example, the outer clamp 20c may be fixedly connected to the pillar 21 using a guide rail and a chute; or the outer clamp 20c is connected to the pillar 21 using bolts; or the outer clamp 20c is connected to the pillar 21 using pins. In this implementation manner, the outer clamp 20c is provided with guide rails 240 and 250, and the pillar 21 is provided with chutes 215a and 214a that cooperate with the guide rails 240 and 250. Specifically, the third side edge 25 and the fourth side edge 24 of the outer clamp 20c are detachably fastened to two side faces 20d outside the pillar 21, and the third side edge 24 and the fourth side edge 25 are connected in a right angle. The third side edge 24 and the fourth side edge 25 are detachably fastened to the pillar 21, which facilitates quick assembly of the cabinet 100, resolves a problem that it is difficult to assemble an outdoor cabinet, reduces processing difficulty of the pillar 21, improves processing efficiency, and reduces cabinet costs. The third side edge 24 and the fourth side edge 25 extend along the axial direction of the pillar 21. The third side edge 24 includes the slide rail 240 that cooperates with the chute 215a, and the fourth side edge 25 includes the slide rail 250 that cooperates with the chute 214a. Such slide rail-chute cooperation allows quick assembly, to improve processing efficiency, reduce cabinet costs, and resolve the problem that it is difficult to assemble an existing cabinet. In other implementation manners, it may also be that the outer clamp 20c is provided with a chute and the pillar 21 is provided with a guide rail that cooperates with the chute. The chute 214a and the chute 215a are both T-shaped chutes.

Referring to FIG. 9 to FIG. 13, the slide rail 240 includes a first side rail 240a and a second side rail 240b, where the first side rail 240a and the second side rail 240b are parallel to each other, and the first side rail 240a and the second side rail 240b both have L-shaped cross-sections, and bend in directions they are not opposite to each other. In other manners, the first side rail 240a and the second side rail 240b may be also integrated as one to become a T-shaped slide rail. The slide rail 250 includes a third side rail 250a and a fourth side rail 250b, where the third side rail 250a and the fourth side rail 250b are parallel to each other, and the third side rail 250a and the fourth side rail 250b both have L-shaped cross-sections, and bend in directions they leave each other. In other manners, the third side rail 250a and the fourth side rail 250b may be also integrated as one to become a T-shaped slide rail. The third side edge 24 and the fourth side edge 25 may be also integrated as one together with the pillar 21.

When a vertical pillar assembly 20 is fastened to the base 10, the first side connecting piece 121 and the second side connecting piece 122 are located between the first side edge 22 and the second side edge 23, the first side connecting piece 121 is parallel to the first side edge 22, and the second side connecting piece 122 is parallel to the second side edge 23 and connected to the second side edge 23 using a bolt 7. The second side connecting piece 122 is connected to the nut strip 8 using the bolt 7.

Each side plate 50 is disposed between two adjacent vertical pillar assemblies 20, two opposite side edges of each side plate 50 are respectively clamped to two adjacent vertical pillar assemblies 20, and side edges 51 of the side plate 50 are respectively clamped in a first bayonet 21a and a second bayonet 21b. The side edges of each side plate 50 are disposed between the third side edge 24 and the second side edge 23, or are clamped between the first side edge 22 and the fourth side edge 25, to implement boltless installation. The four side plates 50, the base 10, the top frame 30, and the cover 40 enclose a housing cavity 100a. To improve waterproofing against a door plate or a wall plate, the side plate 50 and the first side edge 22 are further provided with the waterproof rubber strip 60. In other implementation manners, if the cabinet 100 is used indoors, the waterproof rubber strip 60 may be also omitted.

One of the side plates 50 may be used as a front door, and to open and close conveniently, the side plate 50 may be installed onto the vertical pillar assemblies 20 (referring to FIG. 2) using hinges 4. The other side plates 50 may be also changed to an openable side panel or rear door.

Figure 14:
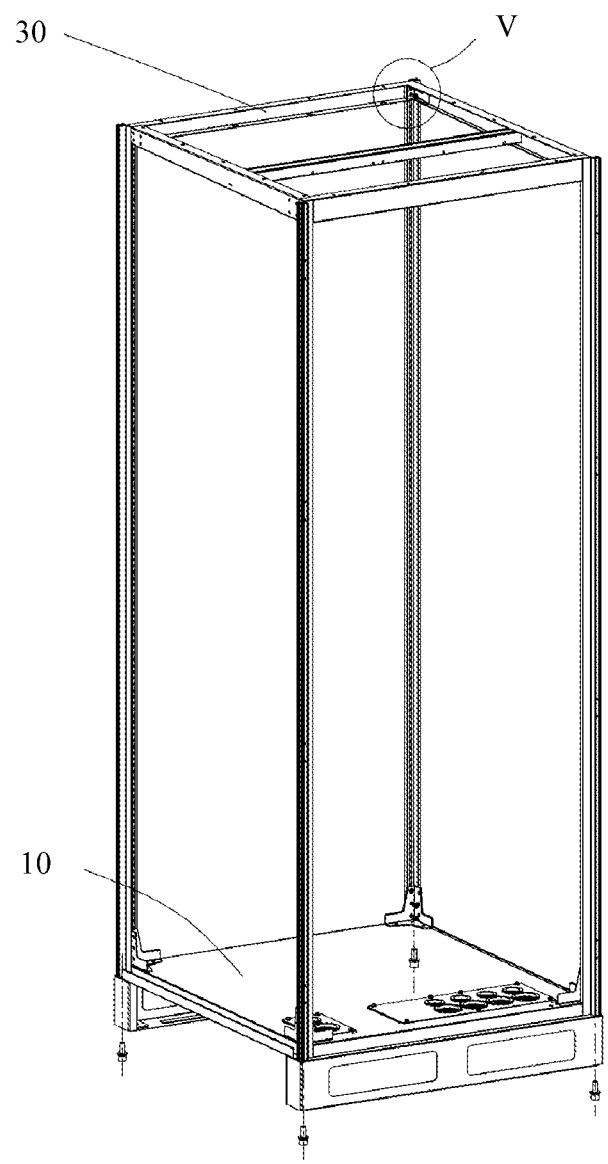
FIG. 14 is a schematic diagram of a part of assembly of the cabinet in FIG. 1.
Figure 15:
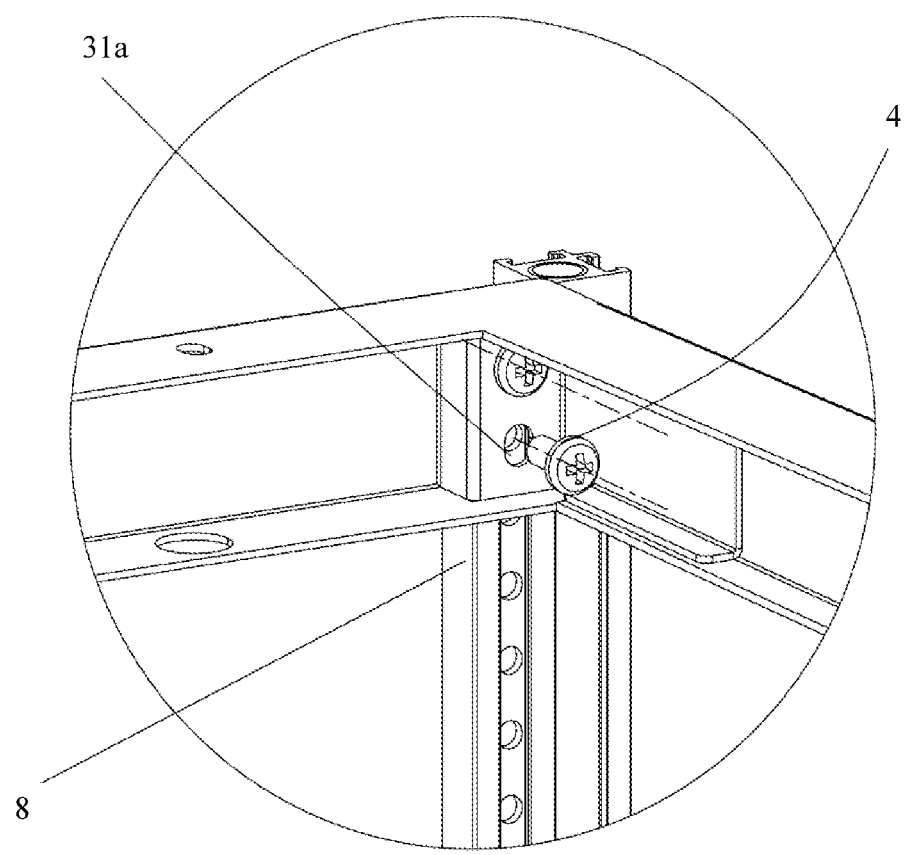
FIG. 15 is a partial enlarged diagram of part V in FIG. 14.

Referring to FIG. 14 and FIG. 15, the top frame 30 and the base 10 are disposed opposite to each other. In this implementation manner, the top frame 30 is a rectangular frame, and four corners of the top frame 30 are provided with gaps 31 (referring to FIG. 1) that cooperate with the two side walls 26a and 26b of the chute 26. A through hole 31a is provided in a gap 31, and is connected to the nut strip 8 using a bolt 4.

The cover 40 is disposed at a side, of the top frame 30, that is far away from the base 10, and four corners of the cover 40 are each provided with a through hole 41 (referring to FIG. 1) that is corresponding to a bolt hole 211a of the other end 211 of the pillar 21, and the cover 40 is connected to the other end 211 of the pillar 21 using a bolt. In other implementation manners, the cover 40 and the top frame 30 may be also integrated as one.

Figure 16:
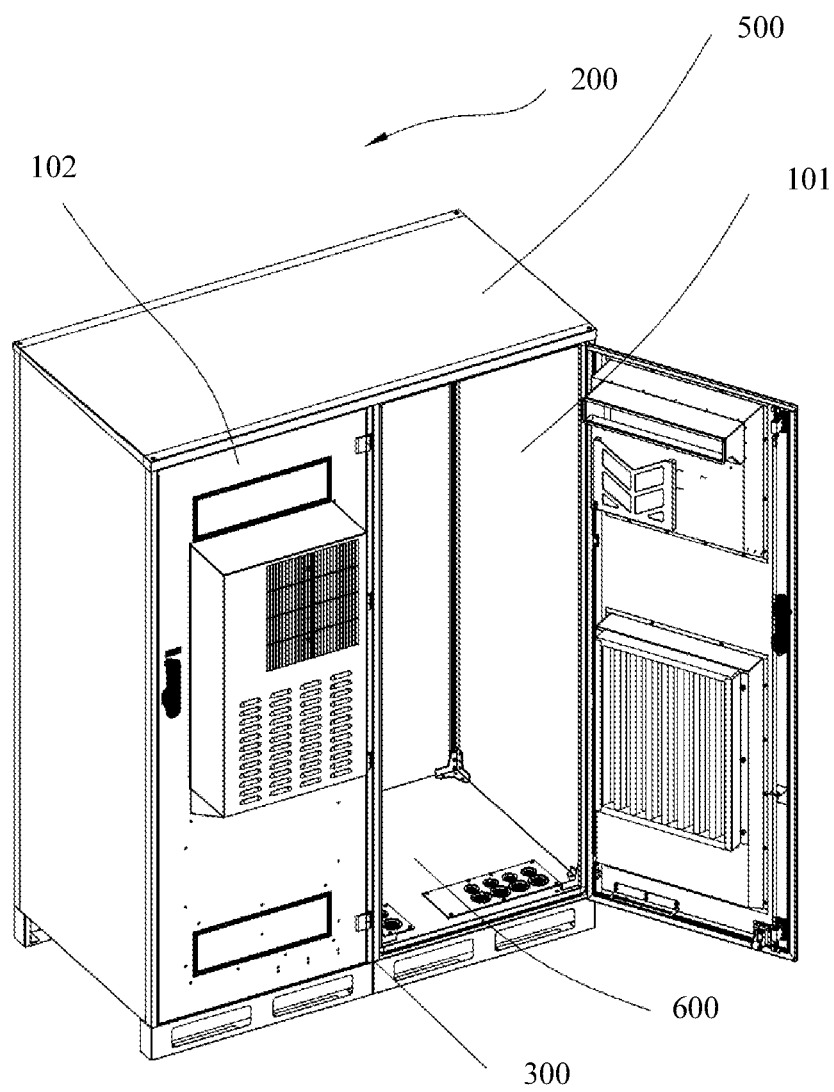
FIG. 16 is a schematic diagram of a cabinet group according to the first embodiment of the present disclosure.
Figure 17:
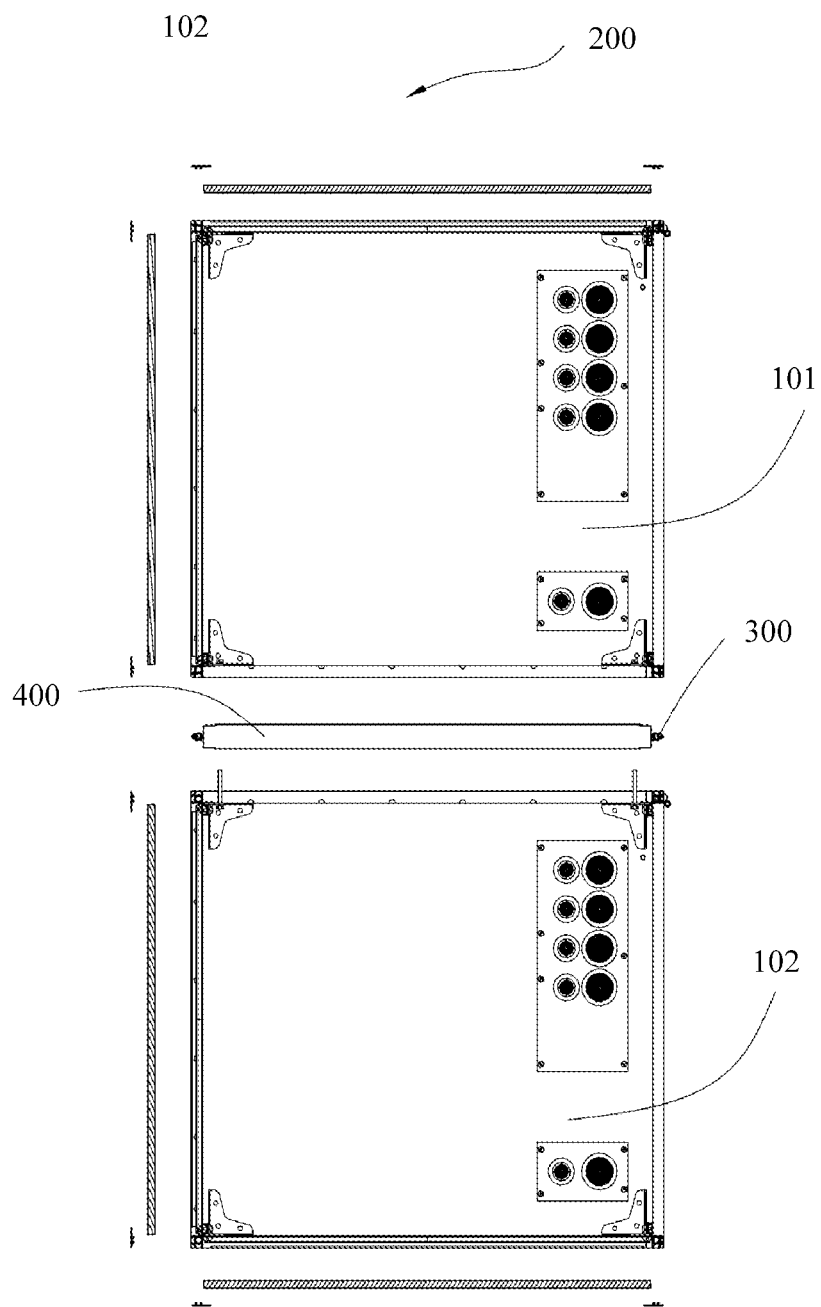
FIG. 17 is a schematic diagram of a part of element of a cabinet of FIG. 16.
Figure 18:
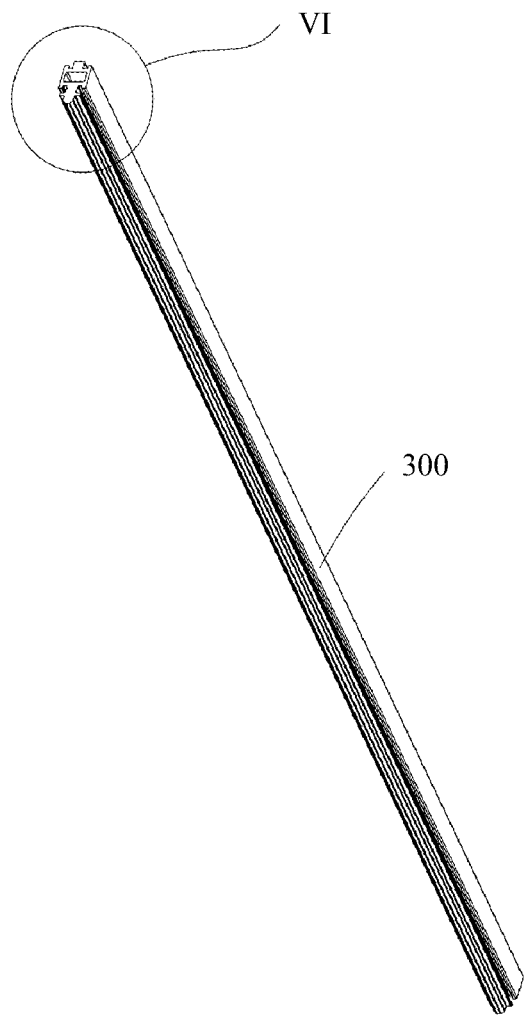
FIG. 18 is a schematic diagram of a connecting kit of the cabinet group in FIG. 16.
Figure 19:
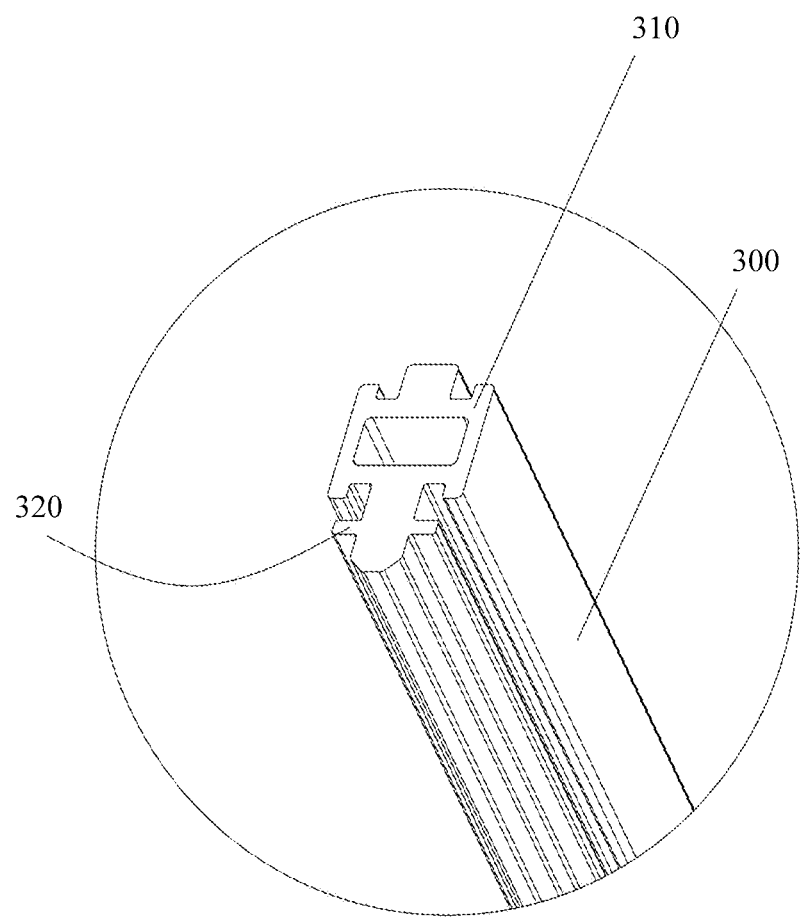
FIG. 19 is a partial enlarged diagram of part VI of FIG. 18.
Figure 20:
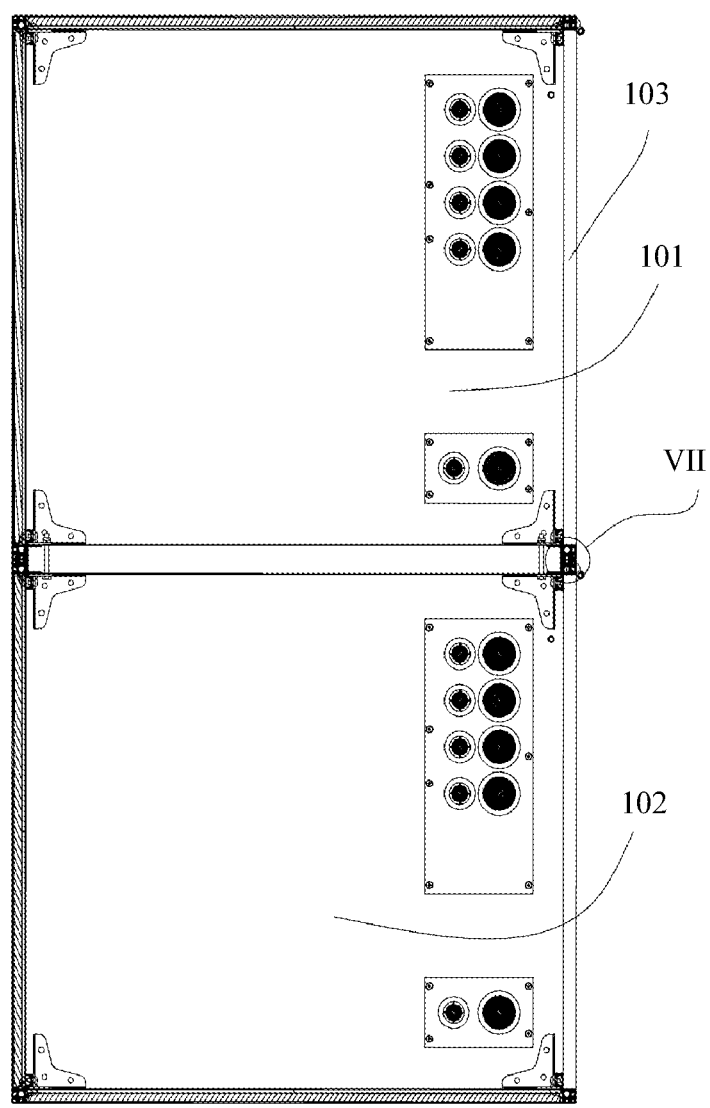
FIG. 20 is a schematic diagram of an interior of the cabinet group in FIG. 16.
Figure 21:
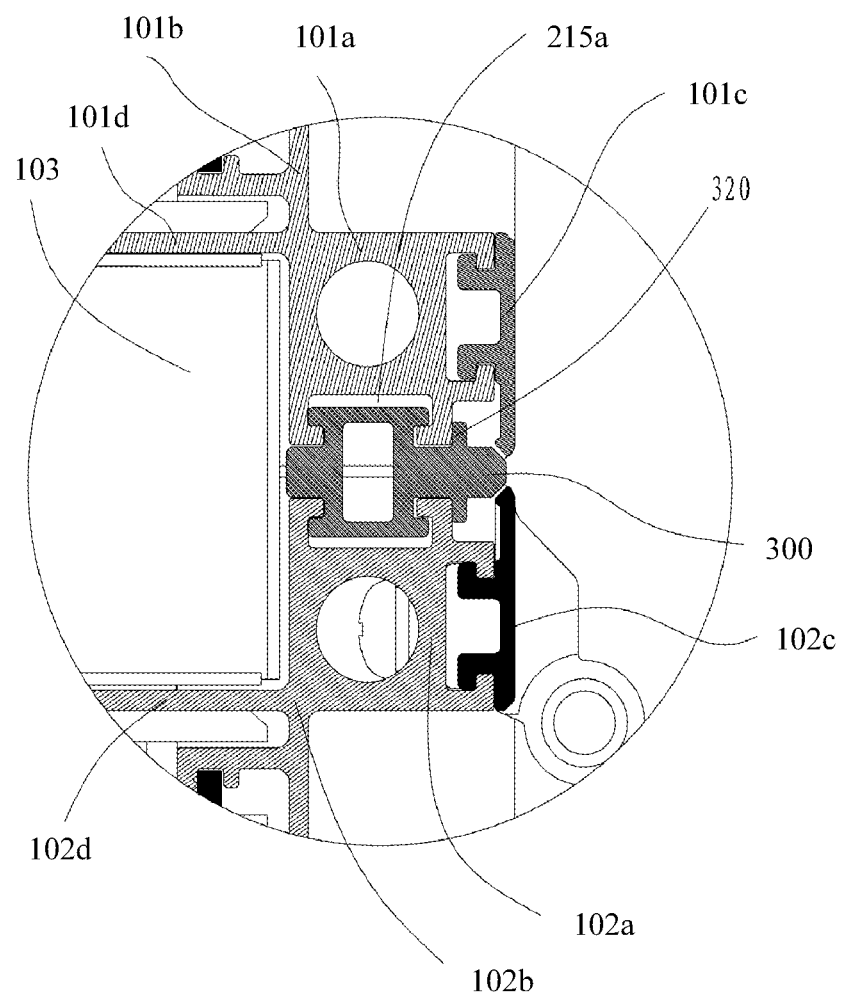
FIG. 21 is a partial enlarged diagram of part VII in FIG. 20.

Referring to FIG. 16 and FIG. 17, FIG. 16 and FIG. 17 show a cabinet group 200 provided by the present disclosure. The cabinet group 200 includes a first cabinet 101, a second cabinet 102, a combining bar 300, and a connection pipe 400. The first cabinet 101 and the second cabinet 102 are totally the same as the foregoing cabinet 100. The first cabinet 101 and the second cabinet 102 are disposed side by side, and the first cabinet 101 and the second cabinet 102 are connected using the combining bar 300 and the connection pipe 400.

The first cabinet 101 and the second cabinet 102 are connected each other without a side plate between them. In other manners, a side plate 103 may be disposed between the two cabinets 100. The cabinet group 200 may be directly connected using the cover 500 and the base 600, such that the connection pipe 400 is omitted.

Referring to FIG. 17 to FIG. 21, two adjacent pillars 101a and 102a of the first cabinet 101 and the second cabinet 102 are provided with inner clamps 101b and 102b and third side edges 101c and 102c of outer clamps. A side plate 103 is clamped between second side edges 101d and 102d of the two inner clamps 101b and 102b of the adjacent two pillars 101a and 102a, and the adjacent pillars 101a and 102a of the first cabinet 101 and the second cabinet 102 are assembled using the combining bar 300.

The combining bar 300 is fixedly connected to the pillars 101a and 102a using chutes and guide rails. In other implementation manners, the combining bar 300 may be also fixedly connected to the pillars 101a and 102a using bolts. The combining bar 300 may be also fixedly connected to the pillars 101a and 102a using pins. The combining bar 300 includes two combining slide rails 310 that are disposed opposite to each other, where the two combining slide rails 310 respectively cooperate with two adjacent chutes 101b and 102b of the first cabinet 101 and the second cabinet 102, to implement boltless cabinet combining in the vertical direction. By using the combining bar 300 including the combining slide rails 310, design efficiency and processing efficiency of the cabinet group 200 can be improved, and quick customization requirements of different customers can be met.

The combining bar 300 further includes two flanges 320, where the two flanges 320 are respectively sealed on two side walls of the chutes 101b and 102b of the first cabinet 101 and the second cabinet 102 that are adjacent, and the two flanges 320 are waterproof labyrinth structures, which achieve International Protection Marking level 5 (IPX5) waterproofing with no bolt, rubber strip, or glue. The cabinet group 200 has an integrated cover 500, which implements integration of the cabinets. The cover 500 is a wide cover, which reduces a gap between the combined cabinets.

The connection pipe 400 is connected between the bases 10 of the first cabinet 101 and the second cabinet 102 that are adjacent using bolts. In other implementation manners, the combining bar 300 may also use an existing combining structure.

In other implementation manners, the cabinet group 200 may also include three or more cabinets. For example, the cabinet group 200 further includes a third cabinet (not shown in the figures), where the third cabinet also includes a base, four vertical pillar assemblies, a top frame, a cover, and three side plates. The base and the top frame are disposed opposite to each other, the cover is disposed at a side, of the top frame, that is far away from the base, the four vertical pillar assemblies are disposed between the base and the top frame, and two opposite side edges of each side plate are respectively clamped to two adjacent vertical pillar assemblies. The two vertical pillar assemblies each include a pillar, an inner clamp, and an outer clamp. The inner clamp includes a first side edge and a second side edge, where end faces of the first side edge and the second side edge form an "L" shape. The outer clamp includes a third side edge and a fourth side edge, where end faces of the third side edge and the fourth side edge form an "L" shape. The pillar is clamped between the inner clamp and the outer clamp. Space between the first side edge of the inner clamp and the third side edge of the outer clamp is used for clamping the side plate, and space between the second side edge of the inner clamp and the fourth side edge of the outer clamp is used for clamping the side plate. Two adjacent pillars 102a of the second cabinet 102 and the third cabinet are each provided with an inner clamp 102b and a third side edge 102c of an outer clamp, a side plate 103 is clamped between second side edges 102d of two inner clamps 102b of the two adjacent pillars 102a, and the adjacent pillars 102a of the second cabinet 102 and the third cabinet are assembled using a combining bar 300.

Figure 22:
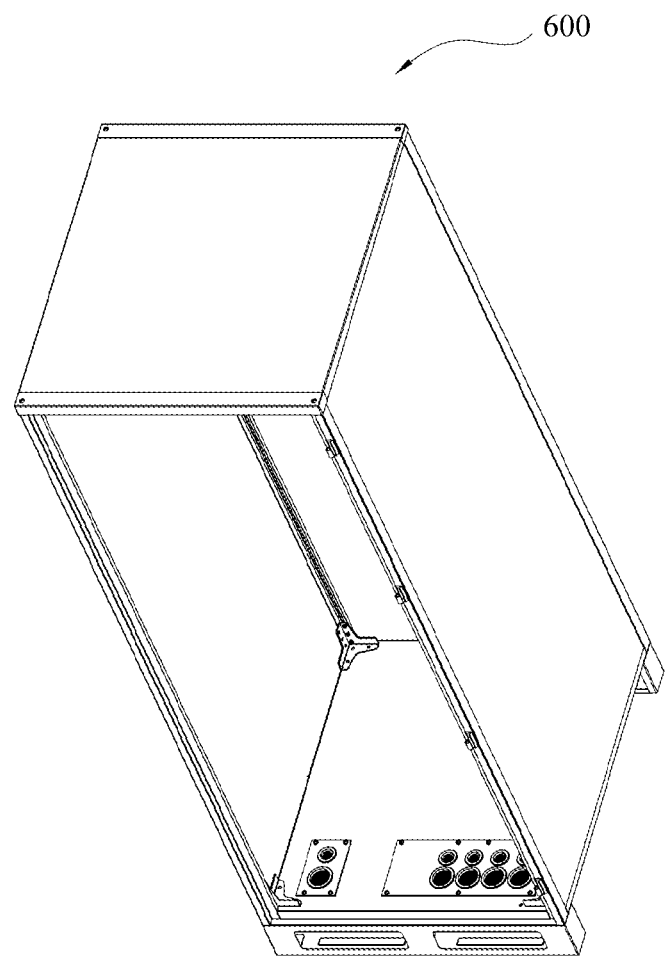
FIG. 22 is a schematic diagram of the second embodiment of a cabinet according to the present disclosure.
Figure 23:
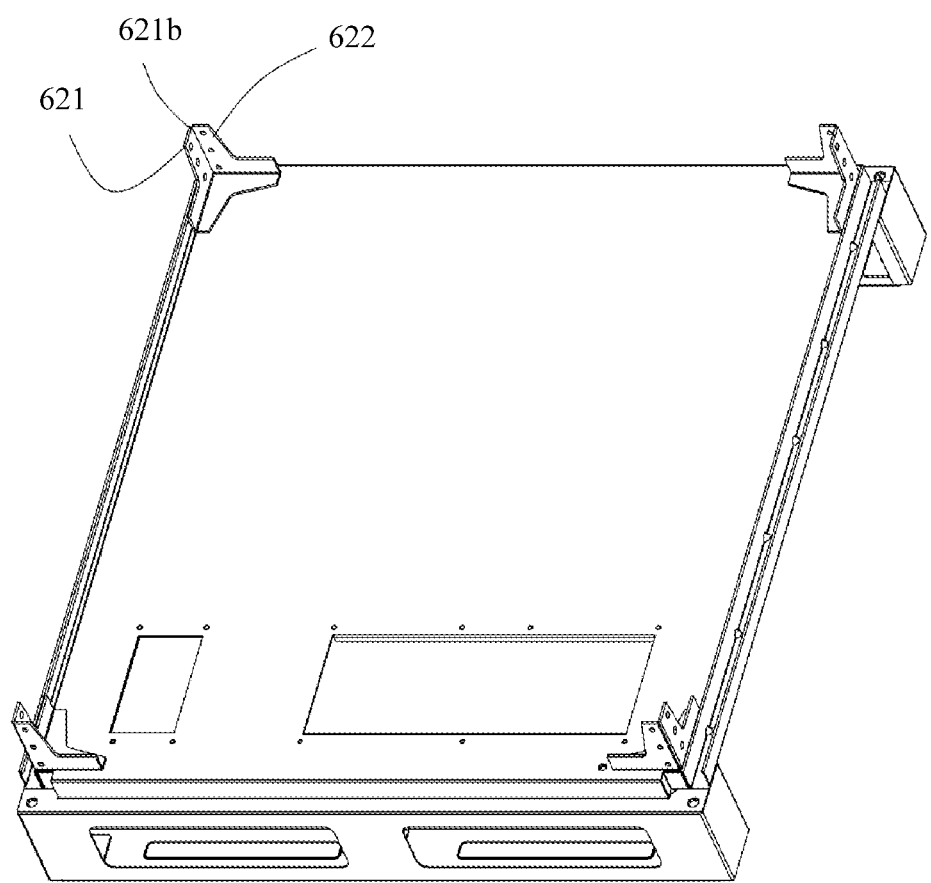
FIG. 23 is a schematic diagram of a base in FIG. 22.
Figure 24:
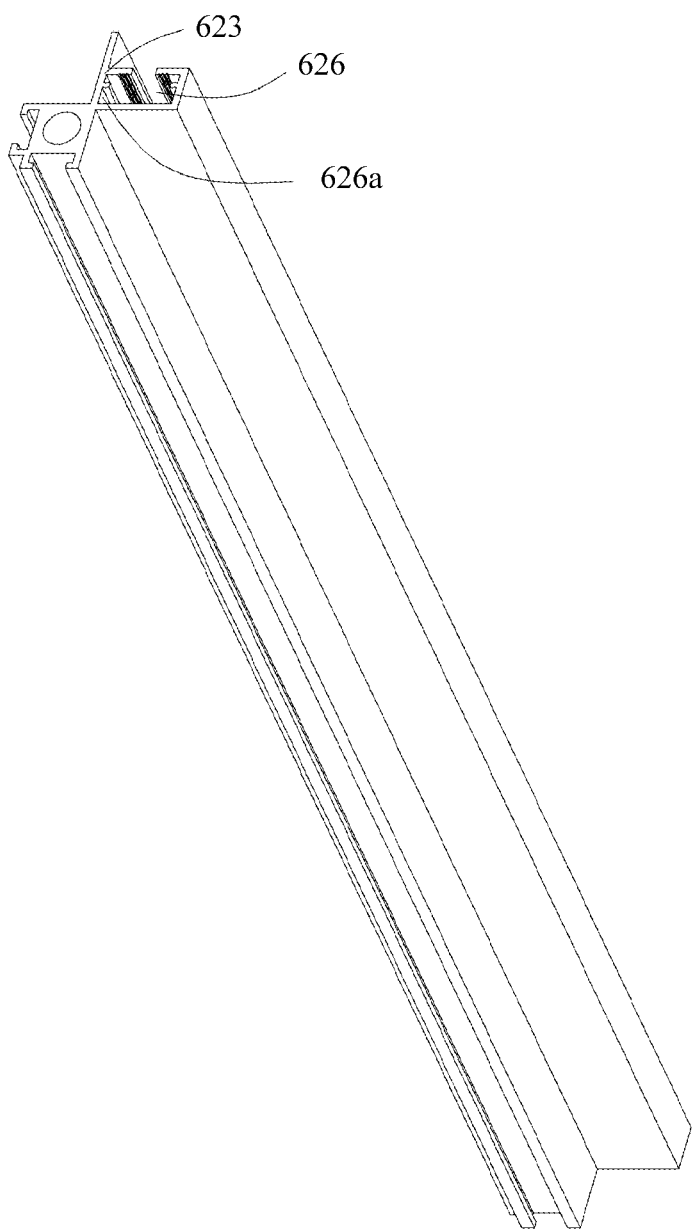
FIG. 24 is a schematic diagram of a part of assembly of a vertical pillar assembly in FIG. 22.

Referring to FIG. 22 to FIG. 24, a cabinet 600 is provided by a second implementation manner of the present disclosure, where the cabinet 600 is basically the same as the cabinet 100 provided by the first implementation manner, and differences lie in that the first side edge 623 and a side wall 626a of a chute 626 and adjacent to a first side edge 623 are integrated as one, and that an edge 621b of a first side connecting piece 621 is aligned with an edge of a second side connecting piece 622.

According to the cabinet provided by the present disclosure, a forming process of a vertical pillar assembly can be simplified by assembly of a detachable outer clamp.

What is disclosed above is merely exemplary embodiments of the present disclosure, and is not intended to limit the protection scope of the present disclosure. Any equivalent modification made in accordance with the claims of the present disclosure shall fall within the scope of the present disclosure.

What is claimed is:

1. A cabinet comprising:
a base;
a top frame disposed opposite the base;
at least three vertical pillar assemblies disposed between the base and the top frame;
a cover disposed at a side of the top frame, wherein the side of the top frame is opposite to a side facing the base; and
at least three side plates,
wherein two opposite side edges of each side plate are respectively clamped to two adjacent vertical pillar assemblies,
wherein at least one of the vertical pillar assemblies comprises a pillar, an inner clamp having a first side edge and a second side edge, and an outer clamp having a third side edge and a fourth side edge,
wherein end faces of the first side edge and the second side edge form an "L" shape,
wherein end faces of the third side edge and the fourth side edge form an "L" shape,
wherein the pillar is clamped between the inner clamp and the outer clamp,
wherein space between the first side edge of the inner clamp and the third side edge of the outer clamp is used for clamping the side plate,
wherein space between the second side edge of the inner clamp and the fourth side edge of the outer clamp is used for clamping the side plate,
wherein the at least three side plates, the base, the top frame, and the cover enclose a housing cavity, and
wherein a nut strip is fastened to at least one of the first side edge and the second side edge,
wherein the base comprises a bearing face and holder,
wherein the holder is fastened vertically on the bearing face, and
wherein the nut strip is fixedly connected to the holder.

2. The cabinet according to claim 1, wherein the inner clamp and the pillar are integrated as one.

3. The cabinet according to claim 1, wherein the outer clamp is detachably fastened to the pillar.

4. The cabinet according to claim 1, wherein the outer clamp is fixedly connected to the pillar using a guide rail and a chute.

5. The cabinet according to claim 4, wherein the outer clamp is provided with the guide rail, and wherein the pillar is provided with the chute that cooperates with the guide rail.

6. The cabinet according to claim 4, wherein the outer clamp is provided with the chute, and wherein the pillar is provided with the guide rail that cooperates with the chute.

7. The cabinet according to claim 1, wherein the pillar is a straight quadrangular prism, and wherein the inner clamp is located at a side edge in a vertex angle position inside the pillar.

8. The cabinet according to claim 7, wherein the third side edge and the fourth side edge of the outer clamp are detachably fastened to two side faces outside the pillar.

9. The cabinet according to claim 1, wherein the base comprises four holders, and wherein the four holders are respectively located at four corners of the base.

10. The cabinet according to claim 1, wherein at least one of the first side edge and the second side edge of the inner clamp is provided with a chute, and
wherein two sides of the nut strip slide cooperatively in the chute.

11. The cabinet according to claim 1, wherein the nut strip is fastened to at least one of the first side edge and the second side edge using bolts.

12. The cabinet according to claim 1, wherein the nut strip is fastened to at least one of the first side edge and the second side edge using pins.

13. A cabinet group comprising:
a first cabinet;
a second cabinet disposed side by side with the first cabinet; and
a combining bar, wherein the first cabinet and the second cabinet each comprise:

a base;

a top frame disposed opposite the base;

at least three vertical pillar assemblies disposed between the base and the top frame;

a cover disposed at a side of the top frame, wherein the side of the top frame is opposite to a side facing the base; and at least three side plates, wherein two opposite side edges of each side plate are respectively clamped to two adjacent vertical pillar assemblies, wherein at least one of the vertical pillar assemblies comprises a pillar, an inner clamp having a first side edge and a second side edge, and an outer clamp having a third side edge and a fourth side edge, wherein end faces of the first side edge and the second side edge form an "L" shape, wherein end faces of the third side edge and the fourth side edge form an "L" shape, wherein the pillar is clamped between the inner clamp and the outer clamp, wherein space between the first side edge of the inner clamp and the third side edge of the outer clamp is used for clamping the side plate, wherein space between the second side edge of the inner clamp and the fourth side edge of the outer clamp is used for clamping the side plate, wherein two adjacent pillars of the first cabinet and the second cabinet are each provided with at least one inner clamp and the third side edge of at least one outer clamp, wherein a side plate is clamped between second side edges of the two inner clamps of the two adjacent pillars, and wherein the adjacent pillars of the first cabinet and the second cabinet are assembled using the combining bar.

14. The cabinet group according to claim 13, wherein the combining bar is fixedly connected to the pillars using chutes and guide rails.

15. The cabinet group according to claim 13, further comprising a third cabinet similar to the first and second cabinet, wherein two adjacent pillars of the second cabinet and the third cabinet are provided with the inner clamp and the third side edge of the outer clamp, wherein a side plate is clamped between second side edges of the two inner clamps of the two adjacent pillars, and wherein the adjacent pillars of the second cabinet and the third cabinet are assembled using a second combining bar.

16. The cabinet group according to claim 13, further comprising a connection pipe connected between the bases of the first cabinet and the second cabinet that are adjacent using bolts.

17. The cabinet group according to claim 13, wherein the combining bar comprises two flanges, and wherein the two flanges are respectively sealed on two side walls of chutes of the first cabinet and the second cabinet that are adjacent.

* * * * *